United States Patent
Lee

[11] Patent Number: 5,953,578
[45] Date of Patent: Sep. 14, 1999

[54] GLOBAL PLANARIZATION METHOD USING PLASMA ETCHING

[75] Inventor: William Wei-Yen Lee, Palo Alto, Calif.

[73] Assignee: Winbond Electronics Corp., Hsinchu, Taiwan

[21] Appl. No.: 09/149,240

[22] Filed: Sep. 8, 1998

[51] Int. Cl.[6] .......................... H01L 21/00; H01L 21/66; H01L 21/302; H01L 21/461
[52] U.S. Cl. ................................. 438/9; 438/16; 438/690; 438/712
[58] Field of Search ........................... 216/66, 67; 438/5, 438/7, 8, 9, 14, 16, 690, 706, 712

[56] References Cited

U.S. PATENT DOCUMENTS

| | | | |
|---|---|---|---|
| 4,986,664 | 1/1991 | Lovoi | 356/376 |
| 5,386,119 | 1/1995 | Ledger | 250/341.1 |
| 5,744,400 | 4/1998 | Dyer | 438/631 |
| 5,795,493 | 8/1998 | Bukhman et al. | 216/59 |
| 5,870,187 | 2/1999 | Uritshk et al. | 356/237 |

*Primary Examiner*—Brian Dutton
*Attorney, Agent, or Firm*—H. C. Lin

[57] ABSTRACT

A semiconductor wafer is planarized by first mapping the flatness profile and then etching the wafer according to the flatness profile. Mapping is accomplished by scanning the wafer with a light beam. The flatness information is obtained by a phase detector comparing the phase of the reflected light beam and a reference light, and is then stored in a memory. The etching is implemented with scanning chemical ion beam etching, in which a reactive gas etches the wafer from spot to spot according to the instantaneous volume of reacting gas or the potential at the wafer, and is controlled by the data stored in the memory. The method can be used to planarize both semiconductor and metal.

16 Claims, 2 Drawing Sheets

GLOBAL PLANARIZATION METHOD USING PLASMA ETCHING

BACKGROUND OF THE INVENTION

This invention relates to surface treatment of semiconductor device surface—particularly to the surface planarization of integrated circuits.

An important consideration in the fabrication of submicron integrated circuits (IC) is planarity. With dimensions at submicron levels and with increased number of metal interconnection layers in very large scale integration (VLSI), the metal thinning that can occur over steep topographies becomes very serious problems. The yield and reliability can be adversely affected. Chemical-mechanical polishing (CMP) has been widely used to planarize the surfaces of high density integrated circuits.

In the CMP process, a microabrasive material is applied and rubbed by a specialized polishing pad, which uniformly removes the top surface of films that have been deposited on the wafer. There are, however, several issues affecting the adoption of CMP. An overriding difficulty is wafer throughput. Ideally, the process would involve a single-pass system capable of reliable production runs. Lack of an endpoint system for measuring oxide film thickness during polishing is another problem. Contamination is still another issue. As a result, the process tends to weaken the underlying oxide. To date, the CMP is an extremely difficult process. Yet, it is the only available method. The need for global flatness remains not satisfactorily fulfilled.

SUMMARY OF THE INVENTION

An object of this invention is to provide a global planarization method which is nonmechanical. Another object of this invention is to provide a planarization method which does not damage the underlying material. Still another object of this invention is to provide a planarization method which does not produce contaminating particles.

These object are achieved by using plasma etching to remove the unevenness of the integrated circuit surface. The wafer is first mapped according to the flatness profile by scanning the wafer with a light beam. The mapped profile is stored in a memory. The stored profile is used to control the etching at different spots on the wafer.

Etching is accomplished with ion beam which etches the surface of the wafer according to the volume of the reacting gas in a discharge chamber or the potential on the wafers. The volume of the reacting gas is made proportional to the profile information stored in the memory.

DETAILED DESCRIPTION OF THE PREFERRED EMBODIMENT

The principle of this invention is to use chemical ion beam etching to remove the uneven portions of an IC surface so that the surface is planarized. The implementation of this principle involves two procedures.:

(1) Obtaining a two dimensional plot of the topography of an in-process wafer:—The wafer is scanned, in raster fashion, as in a television set or a scanner, with a light beam such as a laser beam. The scanner is implemented either mechanically or electro-optically. The phase of the reflected light of the scanning light is detected and compared with a reference light in a phase detector. The phase difference is a linear function of the of the height of the surface spot being scanned, and is stored in a digital memory. Thus the topology of the complete surface is mapped after the complete surface is scanned. This stored information is then a faithful mapping of the surface profile of the wafer, in digital form.

Figure 1:
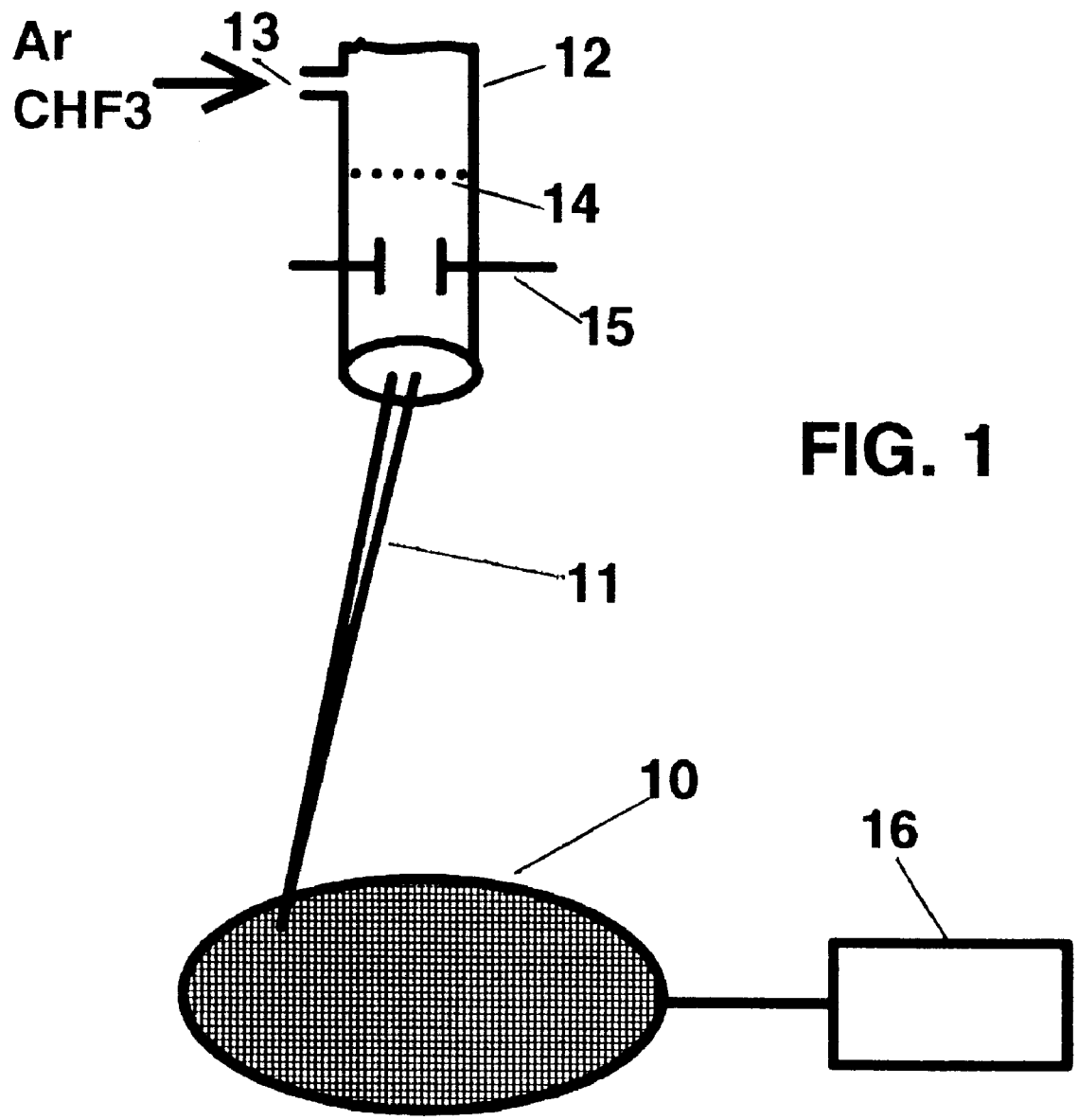
FIG. 1 shows the apparatus for planarizing an IC for this invention.

(2) Chemical ion-milling of the wafer:—An ion milling machine as shown in FIG. 1 is used. The machine comprises an ion gun with a gas inlet 13. The gases contain inert such as argon (Ar) and reactive fluorocarbon gas such as carbon-tetrafluoride ($CF_4$) or carbon-hydrofluoride ($CHF_3$) . The gas mixture is ionized in a discharge chamber 12 and focused to form a beam 11 to project on a wafer 10. The beam scans the wafer by the deflection plates 15 with a kinetic energy mainly determined by the bias voltage 16 on the wafer holder. The gases fed to the inlet 13 etch the oxide on the wafer where the beam falls. The etch rate depends on the volume of the reactive component which is mixed with the insert gas and/or the voltage 16 on the wafer.

The procedure of planarization of the wafer is as follows: Initially, a feature profile (i.e. the topography) of the wafer is obtained and stored in a memory. As the focused beam 11 scans the wafer 10, the volume of the reactive gas is controlled by the profile signal in synchronization with the beam. Thus, more gas is released to correspond with a high profile spot on the wafer and to etch the high profile spot, and less gas is released to etch a low profile spot. After one complete pass of the ion beam, a new topography map is generated and may be used for a second pass. With each scan, the surface becomes flatter. The process can be repeated until the flatness of the wafer meets the required specification.

The wavelength of the laser light should be chosen to be longer than the maximum deviation of the surface feature. The deposition of a thick dielectric layer on the silicon surface has a snow-drifting effect and covers many small objects on the wafer. The spacial frequency on the dielectric surface is much lower than the fine silicon features underneath the dielectric layer. Thus, the beam size for etching can be much larger than the fine feature of the silicon.

Figure 2:
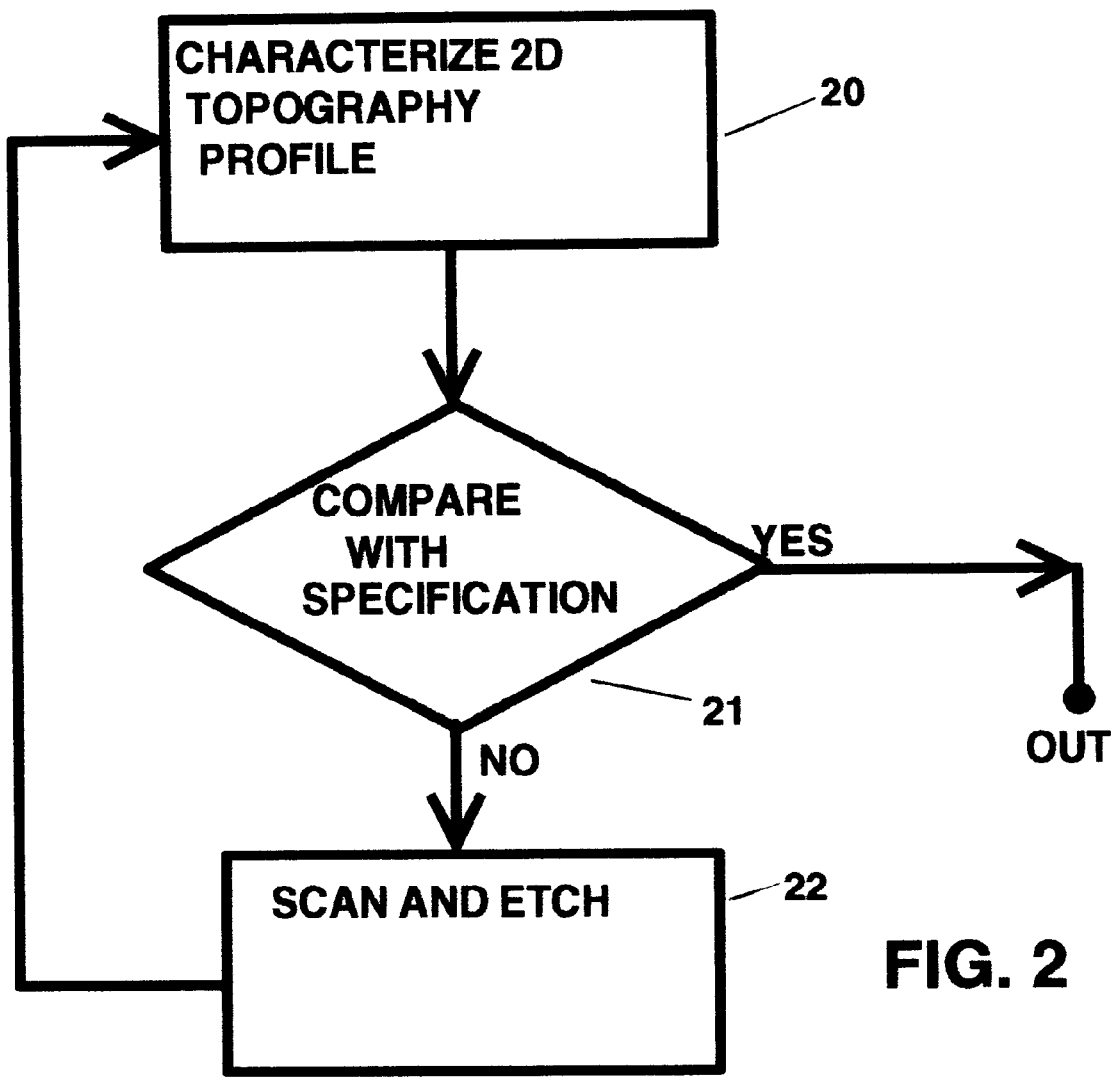
FIG. 2 shows a flow diagram for automatically planarizing an IC surface for this invention.

The planarization cycle is shown in FIG.2. The topographical information stored in the memory 20 is compared with the flatness specification in step 21. If the topographical information at any particular spot does not satisfy the specification, the ion etching is activated as represented by block 22. The beam scans the wafer continuously at it etches, and comparison is made continuously. In this manner, the cycle is repeated until the entire wafer is scanned. While the foregoing description is for planarizing silicon surface, the same process can be used to planarize the metal surface on a wafer.

While the preferred embodiment of the invention has been shown and described , it will be apparent to those skilled in the art that various modifications may be made in the embodiment without departing from the spirit of the present invention. Such modifications are all within the scope of this invention.

What is claimed is:

1. A method of planarizing a semiconductor wafer, comprising the steps of:

mapping the non-uniformity of the surface topography of said wafer, and etching said wafer according to said non-uniformity of the surface topography to planarize said wafer.

2. A method of planarizing as described in claim 1, wherein step of said mapping is obtained by scanning said wafer with light and measuring the flatness of said wafer.

3. A method of planarizing as described in claim 2, wherein step of scanning is implemented with a scanning light beam and said flatness is measured by a phase detector detecting the phase difference between the reflected light of said light beam and a light reference.

4. A method of planarizing as described in claim 3, wherein said scanning light is a laser light.

5. A method of planarizing as described in claim 3, wherein said scanning light beam is furnished electro-optically.

6. A method of planarizing as described in claim 3, wherein said scanning light is furnished mechanically.

7. A method of planarizing as described in claim 1, wherein said flatness topography is stored in a memory, and said etching is based on the flatness topography stored in said memory.

8. A method of planarizing as described in claim 7, wherein step of said etching is implemented by an ion beam which ionizes an inert gas and reacting gas to etch said wafer.

9. A method of planarizing a semiconductor wafer, comprising the steps of:

mapping the flatness topography of said wafer, and etching said wafer according to said topography to planarize said wafer, wherein said etching is implemented by an ion beam which ionizes an inert gas and reacting gas to etch said wafer and the etching rate of said step of etching is controlled by the density of said reacting gas.

10. A method of planarizing as described in claim 9, wherein said density is made proportional to the flatness topography stored in said memory.

11. A method of planarizing as described in claim 9, wherein said inert gas is argon.

12. A method of planarizing as described in claim 9, wherein said reacting gas is selected from a group of fluoro-carbon consisting of $CF_4$ and $CHF_3$.

13. A method of planarizing as described in claim 9, wherein the wavelength of the beam size is longer than the maximum excursion of the surface feature of the wafer.

14. A method of planarizing as described in claim 13, wherein said surface feature size is of sub-micron dimension.

15. A method of planarizing as described in claim 9, wherein said wafer is etched for more than one pass.

16. A method of planarizing a semiconductor wafer, comprising the steps of:

mapping the flatness topography of said wafer, and etching said wafer according to said topography to planarize said wafer, wherein the etching rate of said step of etching is controlled by the electric potential at the wafer.

* * * * *